(12) United States Patent
Rofougaran et al.

(10) Patent No.: US 8,301,092 B2
(45) Date of Patent: Oct. 30, 2012

(54) METHOD AND SYSTEM FOR A LOW NOISE AMPLIFIER UTILIZING A LEAKY WAVE ANTENNA

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 356 days.

(21) Appl. No.: 12/650,192

(22) Filed: Dec. 30, 2009

(65) Prior Publication Data

US 2010/0311338 A1  Dec. 9, 2010

Related U.S. Application Data

(60) Provisional application No. 61/246,618, filed on Sep. 29, 2009, provisional application No. 61/185,245, filed on Jun. 9, 2009.

(51) Int. Cl.
*H04B 1/04* (2006.01)

(52) U.S. Cl. ............... 455/129; 455/121; 455/232.1; 455/127.2; 455/127.3; 343/700 MS

(58) Field of Classification Search ............ 455/129, 455/121, 232.1, 127.2, 127.3; 343/700 MS
See application file for complete search history.

(56) References Cited

U.S. PATENT DOCUMENTS

| | | | |
|---|---|---|---|
| 5,138,436 A | 8/1992 | Koepf | |
| 5,363,075 A | 11/1994 | Fanucchi | |
| 5,387,885 A | 2/1995 | Chi | |
| 5,717,943 A | 2/1998 | Barker | |
| 5,900,843 A | 5/1999 | Lee | |
| 6,005,520 A | 12/1999 | Nalbandian | |
| 6,603,915 B2 | 8/2003 | Glebov | |
| 6,625,454 B1 * | 9/2003 | Rappaport et al. | 455/446 |
| 6,735,630 B1 | 5/2004 | Gelvin | |
| 6,771,935 B1 | 8/2004 | Leggett | |
| 6,954,236 B1 | 10/2005 | Russell | |
| 7,317,342 B2 | 1/2008 | Saint-Laurent | |
| 7,330,090 B2 * | 2/2008 | Itoh et al. | 333/219 |
| 7,348,928 B2 | 3/2008 | Ma | |
| 7,394,288 B1 | 7/2008 | Agarwal | |
| 7,482,893 B2 * | 1/2009 | Itoh et al. | 333/110 |

(Continued)

OTHER PUBLICATIONS

Iyer et al., "Wireless chip to chip interconnections for multichip modules using leaky wave antennas", Nov. 1993, pp. 2030-2031.

(Continued)

*Primary Examiner* — Sanh Phu
(74) *Attorney, Agent, or Firm* — Farjami & Farjami LLP

(57) ABSTRACT

Methods and systems for a low noise amplifier utilizing a leaky wave antenna are disclosed and may include one or more low-noise amplifiers (LNAs) coupled to one or more leaky wave antennas (LWAs) in a wireless device. RF signals may be received via one or more LNAs coupled to one or more feed points on a LWA. The one or more LNAs may be coupled to the feed points based on an impedance of the feed points and an input impedance of the one or more LNAs. The impedance of the feed points may be configured by locating them along a vertical axis in a resonant cavity of the LWA. The LWAs may be integrated on a chip, and/or on a package or printed circuit board to which the chip is affixed. The RF signals may be amplified by the LNAs and may be down-converted to baseband signals.

20 Claims, 8 Drawing Sheets

U.S. PATENT DOCUMENTS

| | | | |
|---|---|---|---|
| 7,504,885 B2 * | 3/2009 | Oba et al. | 330/284 |
| 7,535,958 B2 | 5/2009 | Best | |
| 2002/0000936 A1 | 1/2002 | Sheen | |
| 2004/0227668 A1 | 11/2004 | Sievenpiper | |
| 2004/0263408 A1 | 12/2004 | Sievenpiper | |
| 2005/0116864 A1 | 6/2005 | Mohamadi | |
| 2006/0066326 A1 | 3/2006 | Slupsky | |
| 2007/0285248 A1 | 12/2007 | Hamel | |
| 2008/0159243 A1 | 7/2008 | Rofougaran | |
| 2008/0258981 A1 | 10/2008 | Achour | |
| 2009/0189801 A1 * | 7/2009 | Forstner et al. | 342/175 |
| 2010/0110943 A2 | 5/2010 | Gummalla | |
| 2010/0176880 A2 * | 7/2010 | Dupuy et al. | 330/124 R |
| 2012/0095531 A1 | 4/2012 | Derbas | |
| 2012/0153731 A9 | 6/2012 | Kirby | |

OTHER PUBLICATIONS

Huang et al., "An Electronically Switchable Leaky Wave Antenna", Nov. 2000, pp. 1769-1772.

Grbic et al, "Leaky CPW-Based Slot Antenna Arrays for Millimeter-Wave Applications", Nov. 2002, pp. 1494-1504.

Floyd et al., "Wireless Interconnects for Clock Distribution", pp. 105-108.

Zvolensky et al., "Leaky-Wave antenna based on micro-electromechanical systems-loaded microstrip line", 2011, pp. 357-363.

* cited by examiner

METHOD AND SYSTEM FOR A LOW NOISE AMPLIFIER UTILIZING A LEAKY WAVE ANTENNA

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on even date herewith;
U.S. patent application Ser. No. 12/650,295 filed on even date herewith;
U.S. patent application Ser. No. 12/650,277 filed on even date herewith;
U.S. patent application Ser. No. 12/650,224 filed on even date herewith;
U.S. patent application Ser. No. 12/650,176 filed on even date herewith;
U.S. patent application Ser. No. 12/650,246 filed on even date herewith;
U.S. patent application Ser. No. 12/650,292 filed on even date herewith; and
U.S. patent application Ser. No. 12/650,324 filed on even date herewith.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a low noise amplifier utilizing a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a low noise amplifier utilizing a leaky wave antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a low noise amplifier utilizing a leaky wave antenna. Exemplary aspects of the invention may comprise one or more low-noise amplifiers coupled to one or more leaky wave antennas in a wireless device. RF signals may be received via one or more low-noise amplifiers coupled to one or more feed points on a leaky wave antenna. The one or more low-noise amplifiers may be coupled to the one or more feed points, based on an impedance of the one or more feed points on the leaky wave antenna and an input impedance of the one or more low-noise amplifiers. The impedance of the one or more feed points may be dependent on a location of the one or more feed points along a vertical axis in a resonant cavity of the leaky wave antenna. A height of the resonant cavity may be one half of a wavelength of the RF signals received by the leaky wave antenna. The vertical axis of the resonant cavity may run from a first reflective surface to a second reflective surface of the resonant cavity. The second reflective surface may be partially reflective. The one or more leaky wave antennas may be integrated on a chip, on a package to which the chip is affixed, and/or on a printed circuit board to which the chip is affixed. RF signals may be amplified by the one or more low-noise amplifiers and may be down-converted to baseband signals.

Figure 1:
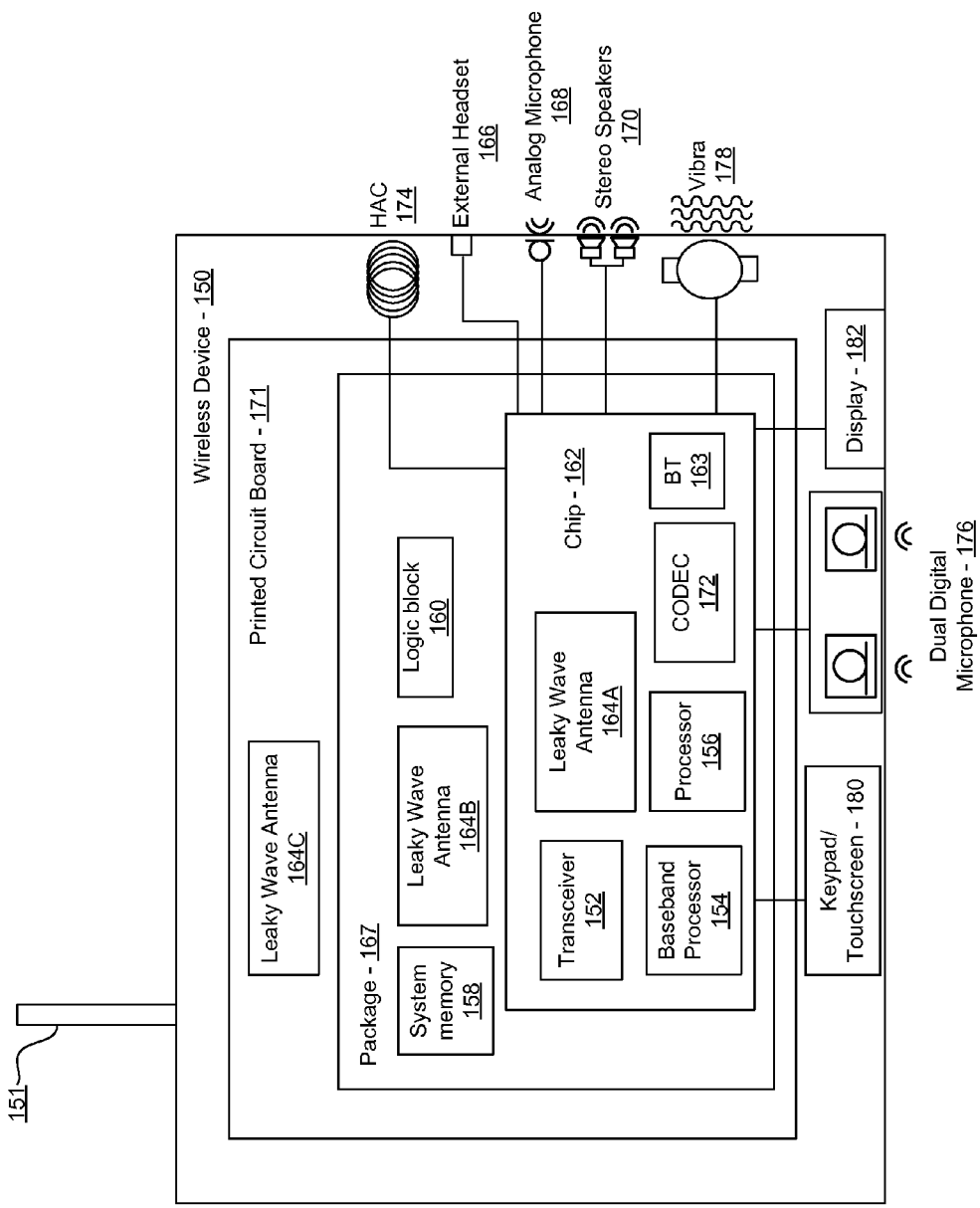
FIG. 1 is a block diagram of an exemplary wireless system utilizing low-noise amplifiers with a leaky wave antenna, which may be utilized in accordance with an embodiment of the invention.

FIG. 1 is a block diagram of an exemplary wireless system utilizing low-noise amplifiers with a leaky wave antenna, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C, an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A, 164B, and 164C. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZigBee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The reduced reflectivity surface may allow the resonant mode to "leak" out of the cavity or conversely into the cavity for received signals. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of reception and/or the beam pattern received. In another embodiment of the invention, the leaky wave antenna 164B may be integrated in and/or on the package 167 and the leaky wave antenna 164C may be integrated in and/or on the printed circuit board 171 to which the chip 162 may be affixed. In this manner, the dimensions of the leaky wave antenna 164B and 164C may not be limited by the size of the chip 162. By configuring feed points on the leaky wave antennas 164A, 164B, and 164C at an appropriate position in the vertical direction, the impedance at the feed points may be matched to one or more low-noise amplifiers (LNAs) in the transceiver 152.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

Wireless signals may be received by the leaky wave antenna 164A and/or 164B. The receive beam pattern for the leaky wave antennas 164A, 164B, and 164C may be configured by adjusting the frequency of the signal communicated to the leaky wave antennas 164A, 164B, and 164C. Furthermore, the physical characteristics of the leaky wave antennas 164A, 164B, and 164C may be configured to adjust the bandwidth of the received signal.

In an embodiment of the invention, the leaky wave antennas 164A, 164B, and 164C may comprise one or more feed points that may be located at different locations in the vertical direction in the vertical cavity. In this manner, different impedances may be obtained that may be matched to the input impedance of one or more LNAs in the transceiver 152. The leaky wave antennas 164A, 164B, and 164C are described further in FIGS. 2-6.

Figure 2:
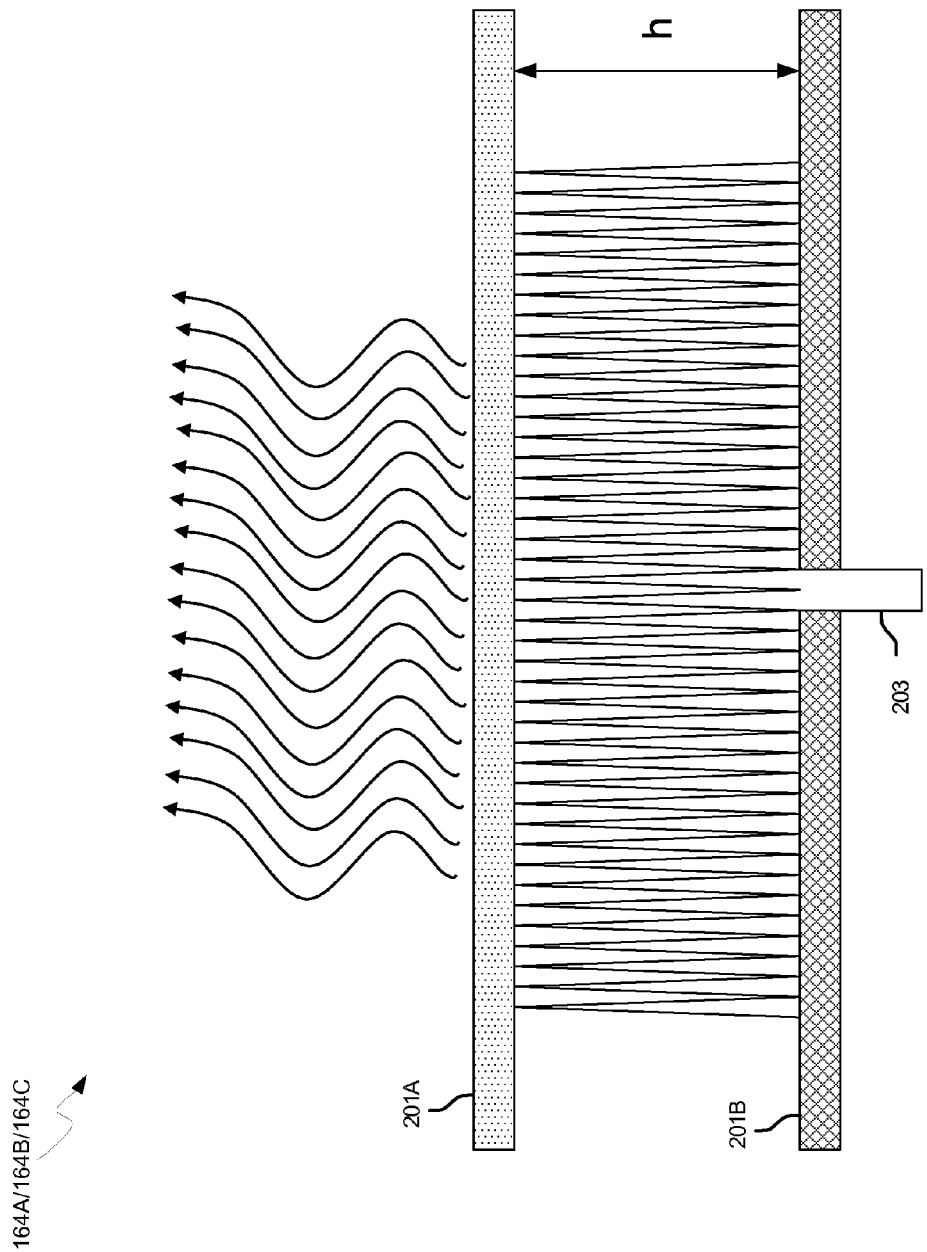
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antenna 164A/164B/164C comprising a partially reflective surface 201A, a reflective surface 201B, a feed point 203, and a resonant cavity 210. The space between the partially reflective surface 201A and the reflective surface 201B may be filled with dielectric material, for example, and may define the resonant cavity 210. The height, h, between the partially reflective surface 201A and the reflective surface 201B may be utilized to configure the frequency of transmission and/or reception of the leaky wave antenna 164A/164B/164C.

The feed point 203 may comprise an input terminal for receiving an output voltage from the leaky wave antenna 164A/164B/164C. The invention is not limited to a single feed point 203, as there may be any amount of feed points for different impedances, for example, for LNAs coupled to the leaky wave antenna 164A/164B/164C.

Figure 3:
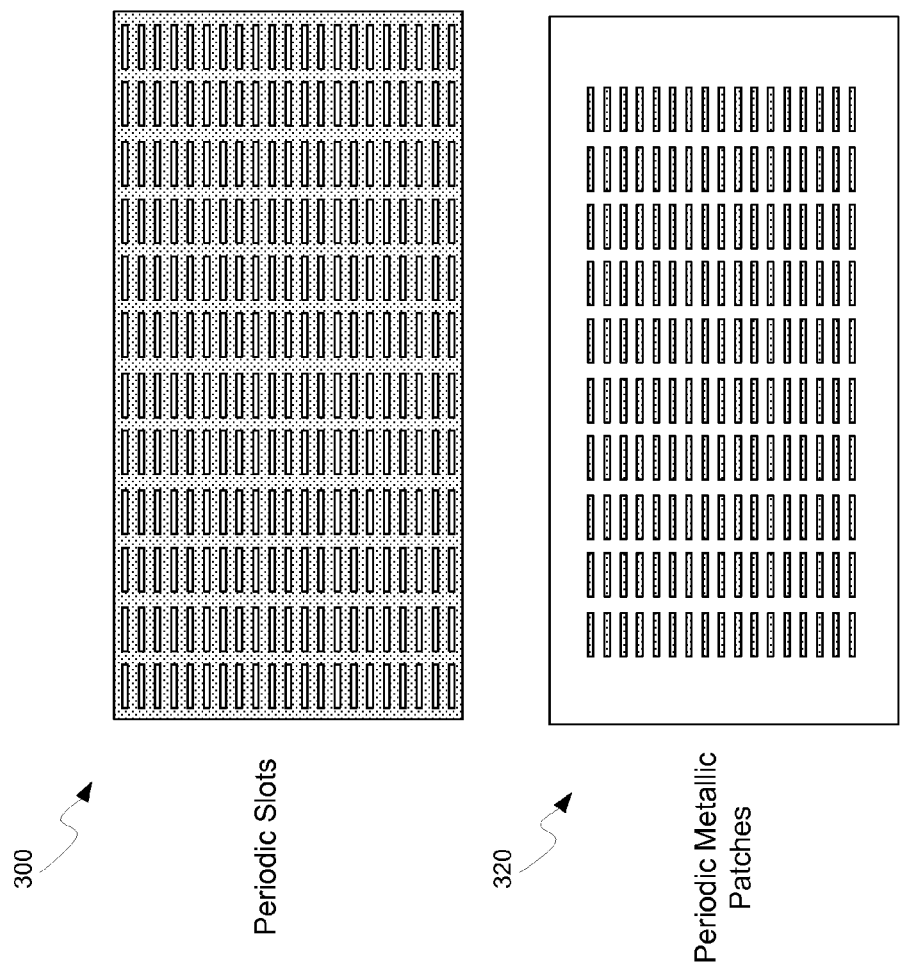
FIG. 3 is a block diagram illustrating a plan view of exemplary partially reflective surfaces, in accordance with an embodiment of the invention.

In an embodiment of the invention, the height, h, of the resonant cavity 210 may be one-half the wavelength of the received mode from the leaky wave antenna 164A/164B/164C. In this manner, the phase of an electromagnetic mode that traverses the cavity twice may be coherent with the signal received at the partially reflected surface 201A, thereby configuring a resonant cavity known as a Fabry-Perot cavity. The magnitude of the resonant mode may decay exponentially in the lateral direction from the edge of the features in the partially reflective surface 201, as shown in FIG. 3, thereby reducing or eliminating the need for confinement structures to the sides of the leaky wave antenna 164A/164B/164C. The output impedance of the leaky wave antenna 164A/164B/164C may be configured by the vertical placement of the feed point 203, as described further in FIG. 6.

In operation, an RF signal may be received by the leaky wave antenna 164A/164B/164C at the partially reflective surface 201A. The cavity height, h, of the resonant cavity 210 may be configured to correlate to one half the wavelength of the signal of frequency f. The signal may traverse the height of the cavity and may be reflected by the reflective surface 201B, and then traverse the height back to the partially reflective surface 201A. Since the wave will have traveled a distance corresponding to a full wavelength, constructive interference may result and a resonant mode may thereby be established. Thus, the electromagnetic potential at any point in the vertical direction within the cavity may comprise a resonant mode, and may result in enhanced gain for the leaky wave antenna 164A/164B/164C.

Leaky wave antennas may enable the configuration of high gain antennas without the need for a large array of antennas which require a complex feed/receive network and suffer from loss due to feed/receive lines. The leaky wave antenna 164A/164B/164C may be integrated on or in a chip, package, or printed circuit board. The leaky wave antenna 164A/164B/164C may comprise an antenna for one or more low-noise amplifiers (LNAs). The input impedance of the leaky wave antenna 164A/164B/164C may be configured to match the input impedance of the LNAs. In this manner, matching circuit requirements may be reduced or eliminated.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches. In an embodiment of the invention, the slots/patches may be configured via micro-electromechanical system (MEMS) switches to tune the Q of the resonant cavity.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

Figure 4:
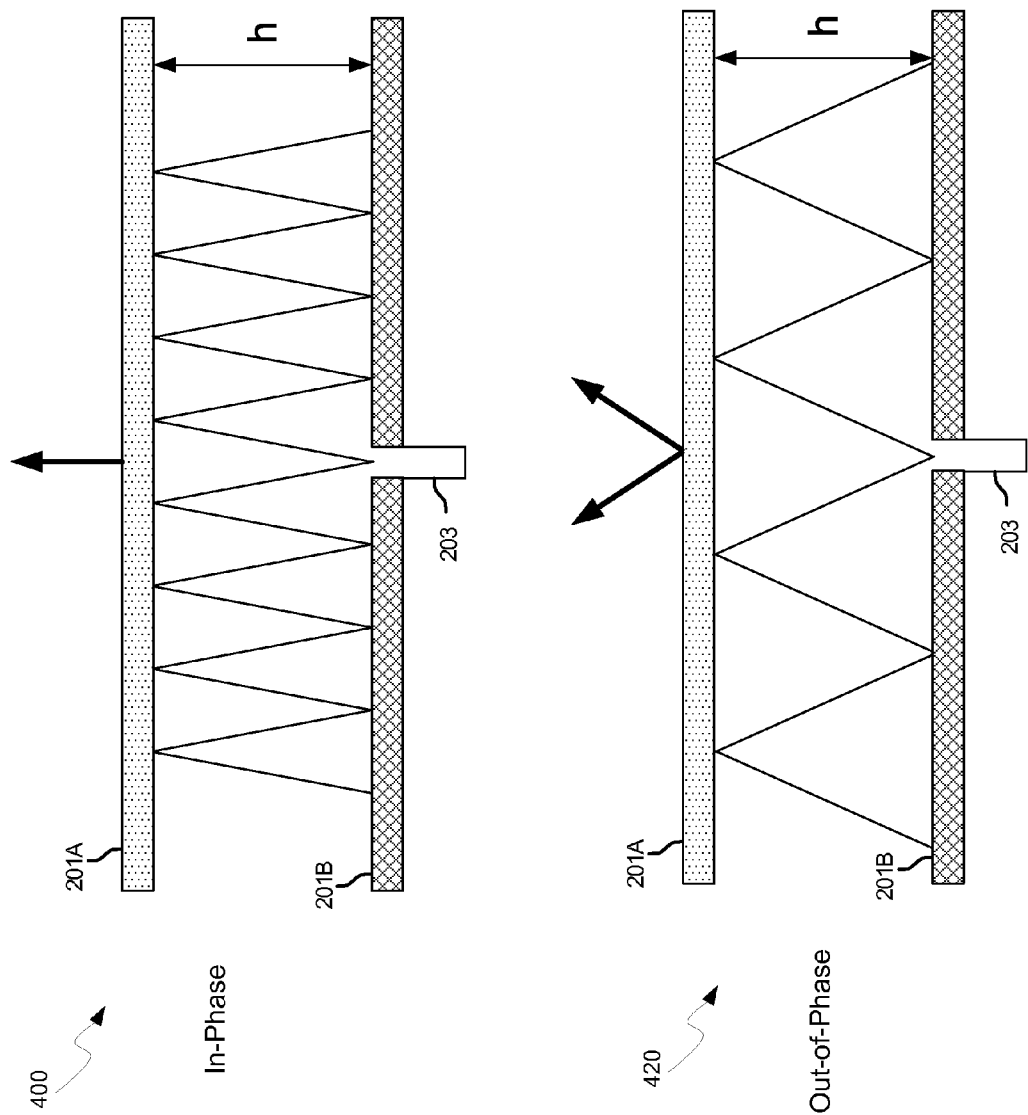
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partial reflective surface 201A, the reflective surface 201B, and the feed point 203. In-phase condition 400 illustrates the relative beam shape transmitted and/or received by the leaky wave antenna 164A/164B/164C when the frequency of the signal received matches that of the resonant cavity as defined by the cavity height h and the dielectric constant of the material between the reflective surfaces.

Similarly, out-of-phase condition 420 illustrates the relative beam shape transmitted and/or received by the leaky wave antenna 164A/164B/164C when the frequency of the signal received at the partially reflective surface 201A does not match that of the resonant cavity. The resulting beam shape may be conical, as opposed to a single main vertical node. These are illustrated further with respect to FIG. 5.

Figure 5:
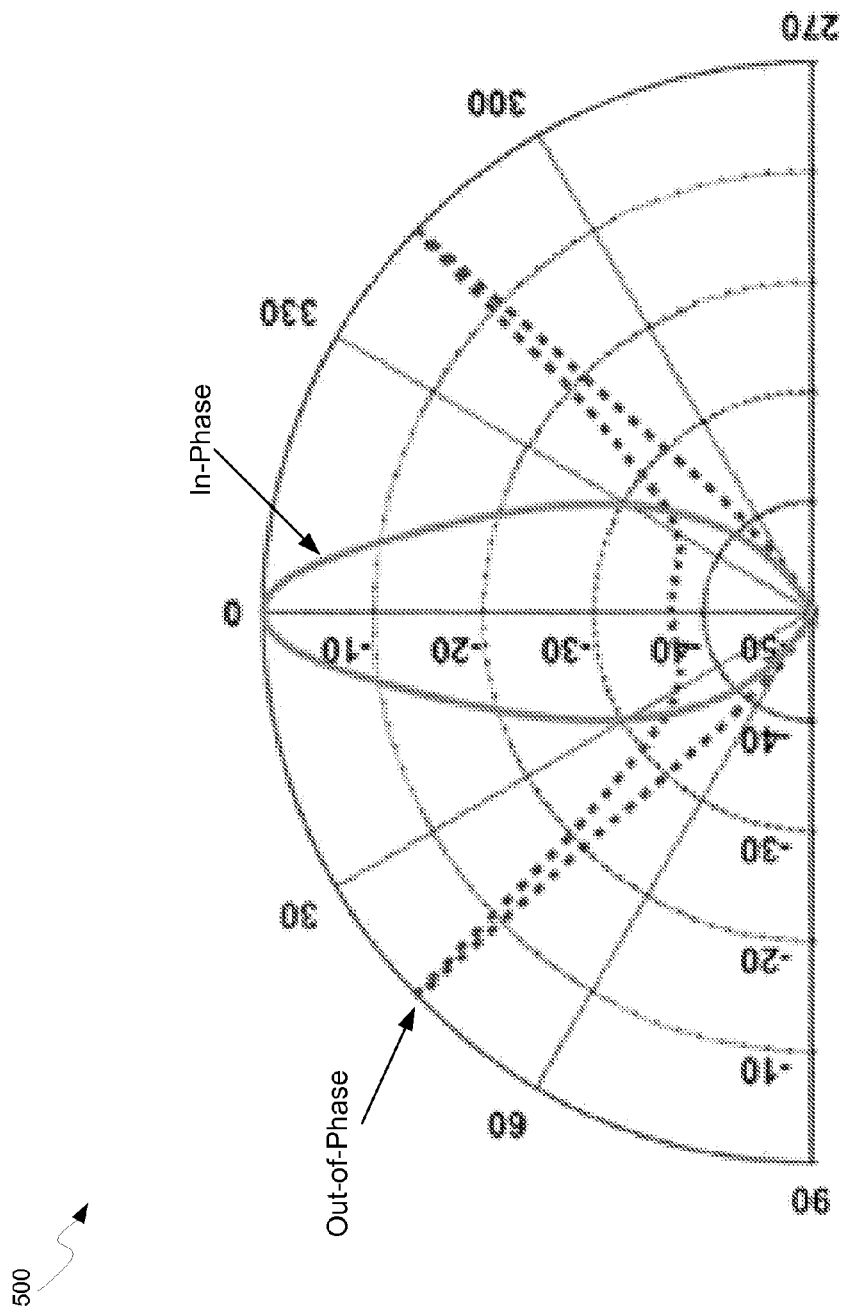
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted/received signal beam shape versus angle for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal received is not at the resonant frequency, a double, or conical-shaped node may be generated as shown by the Out-of-phase curve in the plot 500.

Figure 6:
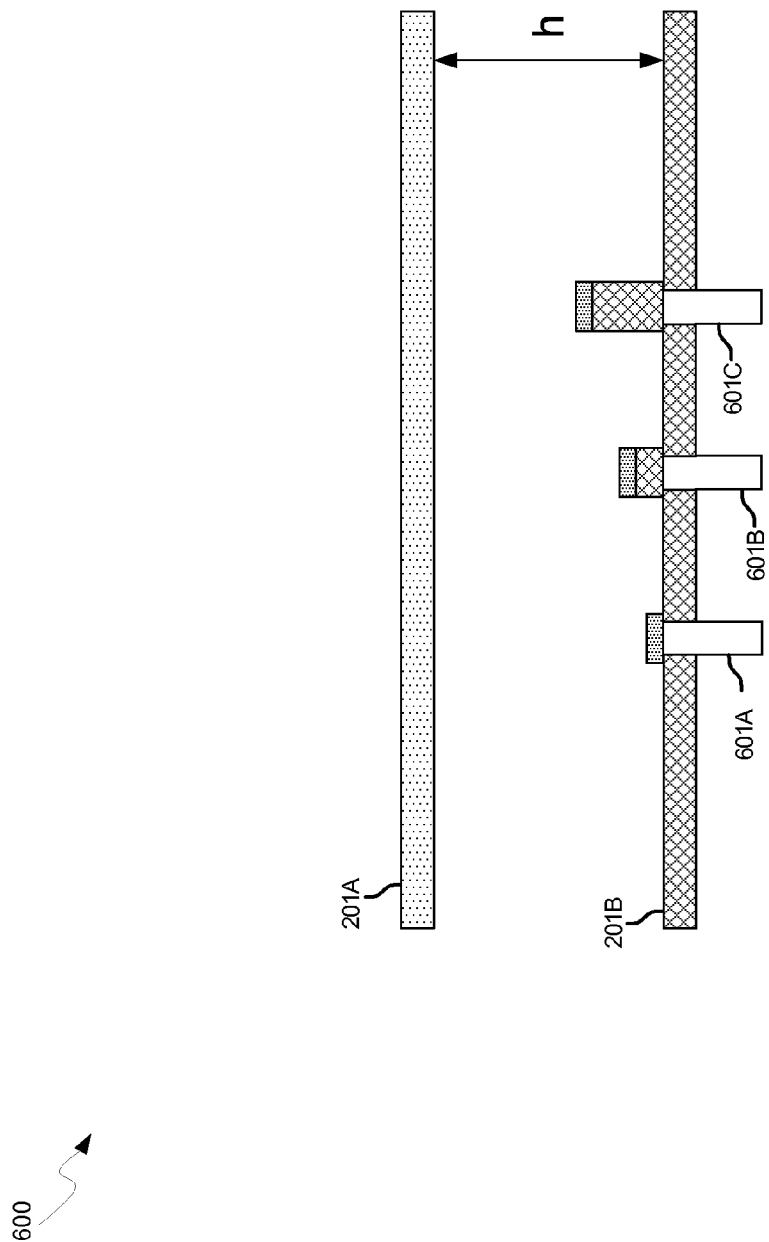
FIG. 6 is a block diagram illustrating a leaky wave antenna with variable impedance feed points, in accordance with an embodiment of the invention.

FIG. 6 is a block diagram illustrating a leaky wave antenna with variable impedance feed points, in accordance with an embodiment of the invention. Referring to FIG. 6, there is shown a leaky wave antenna 600 comprising the partially reflective surface 201A and the reflective surface 201B. There is also shown feed points 601A 601C. The feed points 601A-

601C may be located at different positions along the vertical direction in the cavity thereby configuring different impedance feed points for LNAs of different input impedance that may be coupled to an appropriate impedance feed point of the leaky wave antenna 600.

In this manner, a leaky wave antenna may be operable to couple to LNAs with different input impedances thereby increasing coupling efficiency without requiring impedance matching circuits. Higher impedance LNAs may be coupled to feed points placed higher in the cavity and lower impedance LNAs may be coupled to feed points placed closer to the reflective surface 201B.

Figure 7:
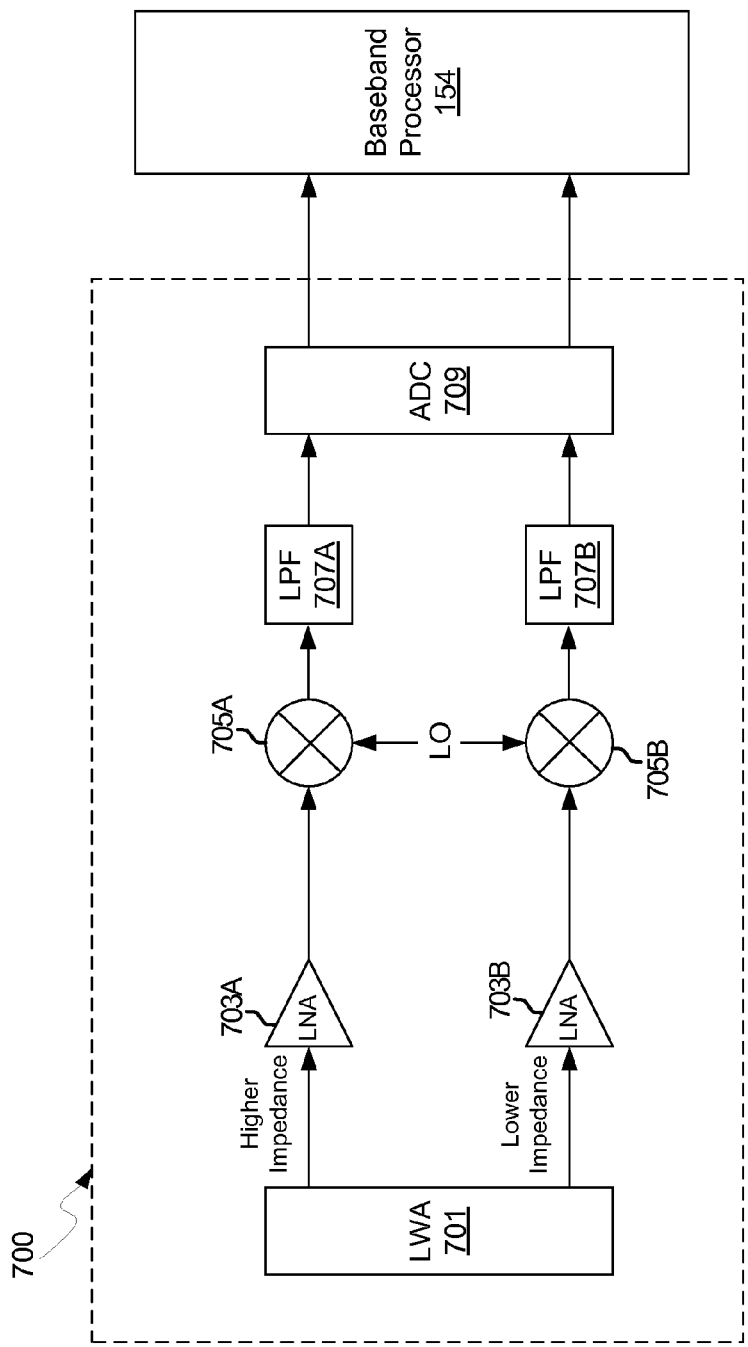
FIG. 7 is a block diagram of low-noise amplifiers utilizing a leaky wave antenna, in accordance with an embodiment of the invention.

FIG. 7 is a block diagram of low-noise amplifiers utilizing a leaky wave antenna, in accordance with an embodiment of the invention. Referring to FIG. 7, there is shown a receiver (Rx) 700 comprising a leaky wave antenna 701, low-noise amplifiers (LNAs) 703A and 703B, mixers 705A and 705B, low-pass filters (LPFs) 707A and 707B, an analog to digital converter (ADC) 709. There is also shown the baseband processor 154.

The leaky wave antenna 701 may be substantially similar to leaky wave antennas 164A/164B/164C/600. The LNAs 703A and 703B may comprise suitable circuitry, logic, interfaces, and/or code that may be operable to amplify received signals and may comprise different gain levels, and thus different input impedances. Specifically, the LNAs 703A and 703B may amplify received signals to be communicated to the mixers 705A and 705B.

The mixers 705A and 705B may comprise suitable circuitry, logic, interfaces, and/or code that may be operable to down-convert received signals to baseband frequencies. The mixers 705A and 705B may utilize a received local oscillator (LO) signal, such as from a voltage-controlled oscillator (VCO) or other source, to down-convert the received RF signals, thereby generating sum and difference signals.

The LPFs 707A and 707B may comprise suitable circuitry, logic, interfaces, and/or code that may be operable to filter out higher frequency signals, such as the sum frequencies generated by the mixers 705A and 705B, while allowing lower frequency signals to pass, such as the difference signals generated by the mixers 705A and 705B. The outputs of the LPFs 707A and 707B may be communicatively coupled to the ADC 709.

The ADC 709 may comprise suitable circuitry, logic, interfaces, and/or code that may be operable to convert received analog signals to digital signals for processing by the baseband processor 154. The ADC 709 may be operable to receive more than two signals for conversion.

In operation, the leaky wave antenna 701 may be operable to receive one or more RF signals that may be communicated through one or more feed points to one or more LNAs. In this manner, LNAs with higher input impedance and higher gain may be coupled to higher impedance feed points, as illustrated by the Higher Impedance path. Similarly, lower input impedance LNAs with lower gain may be coupled to lower impedance feed points, as illustrated by the Lower Impedance path.

The mixers 705A and 705B may down-convert the amplified RF signals utilizing the LO signal, thereby generating sum and difference signals that may be communicated to the LPFs 707A and 707B. The sum signals generated by the mixers 705A and 705B may be filtered out while the difference, or baseband, signals may be communicated to the ADC 709 via the LPFs 707A and 707B.

The ADC 709 may convert the filtered signals to digital signals and communicate these converted signals to the baseband processor 154 for further processing.

Figure 8:
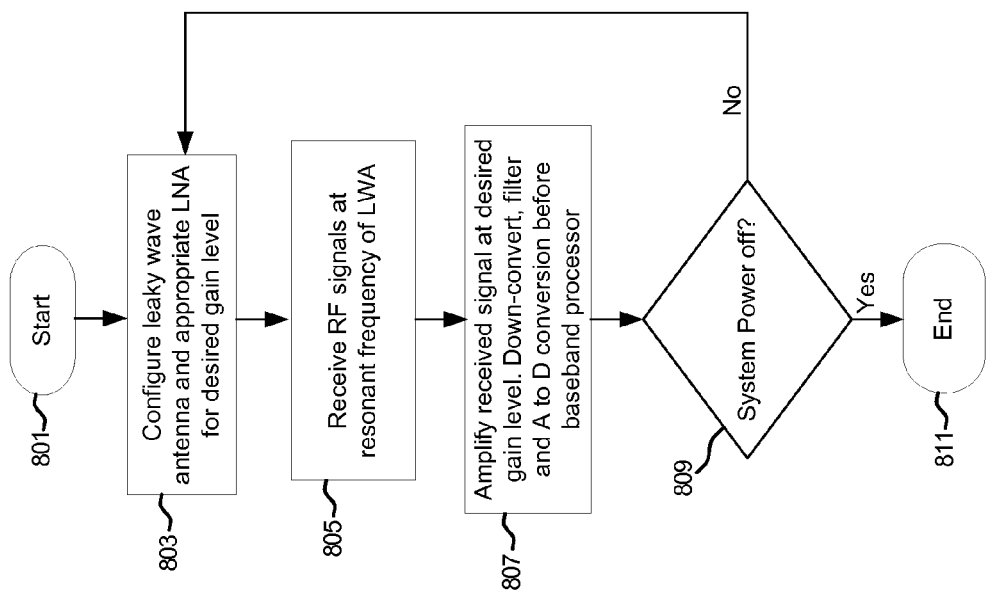
FIG. 8 is a block diagram illustrating exemplary steps for low noise amplifiers utilizing a leaky wave antenna, in accordance with an embodiment of the invention.

FIG. 8 is a block diagram illustrating exemplary steps for low noise amplifiers utilizing a leaky wave antenna, in accordance with an embodiment of the invention. Referring to FIG. 8, in step 803 after start step 801, one or more LNAs may be configured to receive RF signals from feed points on a leaky wave antenna that exhibit an appropriate impedance, thereby matching to the input impedance of the one or more LNAs. In step 805, RF signals may be received by the leaky wave antenna at a resonant frequency of the leaky wave antenna. In step 807 where the RF signals may be amplified by the one or more LNAs, down-converted to baseband, filtered, and analog-to-digital converted before being communicated to the baseband processor. If, in step 809, the wireless device 150 is to be powered down, the exemplary steps may proceed to end step 811. In instances where the wireless device 150 is not to be powered down, the exemplary steps may proceed back to step 803 to configure one or more LNAs to receive RF signals from a leaky wave antenna.

In an embodiment of the invention, a method and system are disclosed for one or more low-noise amplifiers coupled to one or more leaky wave antennas 164A/164B/164C/600/701A in a wireless device 150. RF signals may be received via one or more low-noise amplifiers 703A/703B coupled to one or more feed points 601A 601C on a leaky wave antenna 164A/164B/164C/600/701A. The one or more low-noise amplifiers 703A/703B may be coupled to the one or more feed points 601A-601C based on an impedance of the one or more feed points 601A-601C on the leaky wave antenna 164A/164B/164C/600/701A and an input impedance of the one or more low-noise amplifiers 703A/703B. The impedance of the one or more feed points 601A-601C may be configured by locating the one or more feed points 601A-601C along a vertical axis h in a resonant cavity 210 of the leaky wave antenna 164A/164B/164C/600/701A. A height of the resonant cavity 210 may be one half of a wavelength of the RF signals received by the leaky wave antenna 164A/164B/164C/600/701A. The vertical axis of the resonant cavity 210 may run from a first reflective surface 201B to a second reflective surface 201A of the resonant cavity. The second reflective surface 201A may be partially reflective. The one or more leaky wave antennas 164A/164B/164C/600/701A may be integrated on a chip 162, on a package 167 to which the chip 162 is affixed, and/or on a printed circuit board 171 to which the chip 162 is affixed. The RF signals may be amplified by the one or more low-noise amplifiers 703A/703B and may be down-converted to baseband signals.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for a low noise amplifier utilizing a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for communication, the method comprising:
in a wireless device comprising one or more low-noise amplifiers on a chip, wherein said one or more low-noise amplifiers are coupled to one or more leaky wave antennas:
receiving RF signals via said one or more low-noise amplifiers coupled to one or more feed points on said one or more leaky wave antennas, wherein said one or more low-noise amplifiers are coupled to said one or more feed points based on an impedance of said one or more feed points on said one or more leaky wave antennas and an input impedance of said one or more low-noise amplifiers;
configuring said impedance of said one or more feed points on said one or more leaky wave antennas by locating said one or more feed points at different positions in a resonant cavity of said one or more leaky wave antennas.

2. The method according to claim 1, wherein said different positions in said resonant cavity of said one or more leaky wave antennas are along a substantially vertical axis in said resonant cavity of said one or more leaky wave antennas.

3. The method according to claim 1, wherein a height of said resonant cavity is one half of a wavelength of said RF signals received by said one or more leaky wave antennas.

4. The method according to claim 2, wherein said substantially vertical axis runs from a first reflective surface to a second reflective surface of said resonant cavity.

5. The method according to claim 4, wherein said second reflective surface is partially reflective.

6. The method according to claim 1, wherein said one or more leaky wave antennas are integrated on said chip.

7. The method according to claim 1, wherein said one or more leaky wave antennas are integrated on a package to which said chip is affixed.

8. The method according to claim 1, wherein said one or more leaky wave antennas are integrated on a printed circuit board to which said chip is affixed.

9. The method according to claim 1, comprising amplifying said received RF signals with said one or more low-noise amplifiers.

10. The method according to claim 1, comprising down-converting said RF signals to baseband signals.

11. A system for enabling communication, the system comprising:
one or more circuits comprising one or more low-noise amplifiers, said one or more circuits for use in a wireless device and integrated on a chip, wherein:
said one or more circuits are operable to receive RF signals via said one or more leaky wave antennas coupled to said low-noise amplifiers via one or more feed points on said one or more leaky wave antennas, wherein said one or more low-noise amplifiers are coupled to said one or more feed points based on an impedance of said one or more feed points on said one or more leaky wave antennas and an input impedance of said one or more low-noise amplifiers; and wherein,
said impedance of said one or more feed points on said one or more leaky wave antennas is configured by locating said one or more feed points at different positions in a resonant cavity of said one or more leaky wave antennas.

12. The system according to claim 11, wherein said different positions in said resonant cavity of said one or more leaky wave antennas are along a substantially vertical axis in a resonant cavity of said leaky wave antenna.

13. The system according to claim 11, wherein a height of said resonant cavity is one half of a wavelength of said RF signals received by said leaky wave antenna.

14. The system according to claim 12, wherein said substantially vertical axis runs from a first reflective surface to a second reflective surface of said resonant cavity.

15. The system according to claim 14, wherein said second reflective surface is partially reflective.

16. The system according to claim 11, wherein said one or more leaky wave antennas are integrated on said chip.

17. The system according to claim 11, wherein said one or more leaky wave antennas are integrated on a package to which said chip is affixed.

18. The system according to claim 11, wherein said one or more leaky wave antennas are integrated on a printed circuit board to which said chip is affixed.

19. The system according to claim 11, wherein said one or more circuits are operable to amplify said received RF signals with said one or more low-noise amplifiers.

20. The system according to claim 11, wherein said one or more circuits are operable to down-convert said RF signals to baseband signals.

* * * * *